United States Patent [19]
Felber et al.

[11] Patent Number: 5,199,630
[45] Date of Patent: Apr. 6, 1993

[54] METHOD AND APPARATUS FOR MEASURING THE VIBRATION AMPLITUDE ON AN ENERGY TRANSDUCER

[75] Inventors: Armin Felber, Lucerne; Walter Nehls, Udligenswil, both of Switzerland

[73] Assignee: ESEC SA, Cham, Switzerland

[21] Appl. No.: 824,133

[22] Filed: Jan. 22, 1992

[30] Foreign Application Priority Data

Feb. 15, 1991 [CH] Switzerland ................... 471/91

[51] Int. Cl.$^5$ ............... B23K 1/06; B23K 20/10; B23K 31/12
[52] U.S. Cl. ........................ 228/102; 228/103; 228/110; 228/1.1
[58] Field of Search ............ 228/102, 103, 110, 1.1, 228/8

[56] References Cited

U.S. PATENT DOCUMENTS 4,854,494 8/1989 Von Rabin .................. 228/102

FOREIGN PATENT DOCUMENTS 3241710 5/1984 Fed. Rep. of Germany ...... 228/103
0252837 9/1969 U.S.S.R. ........................ 228/1.1

Primary Examiner—Richard K. Seidel
Assistant Examiner—Jeffrey T. Knapp
Attorney, Agent, or Firm—Egli International

[57] ABSTRACT

A method, and apparatus for performing the method, for the ultrasonic contacting wired connection of electrical circuits to metallic leadframe strips, which apparatus essentially includes a bonding head with the energy transducer located thereon for feeding to the process point of the leadframe strip and for producing a longitudinal vibration amplitude is supplied with a first voltage, the bonding head is associated a measuring head fixed to a machine base, and the measuring head has an optical/electrical sensor which measures the instantaneous amplitude of the longitudinal vibration of the infeed of the bonding head and determining a correction factor mathematically from the measured quantities obtained, and the first ultrasonic value for the vibration amplitude of the energy transducer is calibrated with the correction factor.

10 Claims, 2 Drawing Sheets

METHOD AND APPARATUS FOR MEASURING THE VIBRATION AMPLITUDE ON AN ENERGY TRANSDUCER

BACKGROUND OF THE INVENTION

The invention relates to a method and an apparatus for measuring the vibration amplitude on an energy transducer which, together with a correspondingly constructed bonding head means, is fed to the process point for the ultrasonic contacting wired connection of electrical circuits to metallic leadframe strips, and for producing a mechanical longitudinal vibration is supplied with an inputted, first ultrasonic value for generating a voltage.

In the production of semiconductor chips, the bonding of the wire takes place by the per se known thermosonic process, in which a capillary placed on a front end of a transducer and which guides the wire supplies the necessary ultrasonic energy to be transferred to the contact point or junction for wire welding purposes. The transfer of the ultrasonic energy is dependent on various influence factors, e.g. mechanical changes, which in particular occur during the fixing of the transducer. Another bonding-influencing factor is that the capillary has to be interchangeably fixed to the mounting support as a result of wear and other bonding-influencing factors occur during installation and due to minor, e.g. manufacture-dependent differences in connection with the new capillary to be inserted.

SUMMARY OF THE INVENTION

The present invention deals with the problem of measuring the vibration amplitude on the capillary tip of an energy transducer constructed for bonding electrical circuits. The problem of the invention is to provide a method, and an apparatus for performing the method, by means of which changes in longitudinal vibration, caused in each case by various factors such as replacement of the capillary or tip wear of the capillary, are correspondingly measured and the result of the measurement is used for determining a correction factor for calibrating the ultrasonic energy of the transducer.

According to the method of the invention, the problem is solved in that the instantaneous amplitude of the longitudinal vibration of the energy transducer and the predetermined infeed of the bonding head means are measured and from the thus established measured quantities a correction factor is determined and is used for calibrating the first ultrasonic value and consequently the vibration amplitude of the energy transducer.

The inventive apparatus for performing the method comprises a support element with a bearing plate for a metallic leadframe strip and a bonding head means, which can be fed in with the energy transducer located thereon for bonding electric circuits to the process point of the leadframe strip, characterized in that a correspondingly arranged measuring head in operative connection with a computer and having at least one optical/electrical sensor is provided and that the sensor has an optical operating area making it possible to determine both the path covered for the infeed of the bonding head means and a measured quantity for the longitudinal vibration of the energy transducer and which is activatable with the measured values of the computer.

Further features of the invention can be gathered from the following description in conjunction with the drawing and the other claims.

BRIEF DESCRIPTION OF THE DRAWINGS

The invention is described in greater detail hereinafter relative to the drawings, wherein show.

DETAILED DESCRIPTION OF THE PREFERRED EMBODIMENTS

Figure 1:
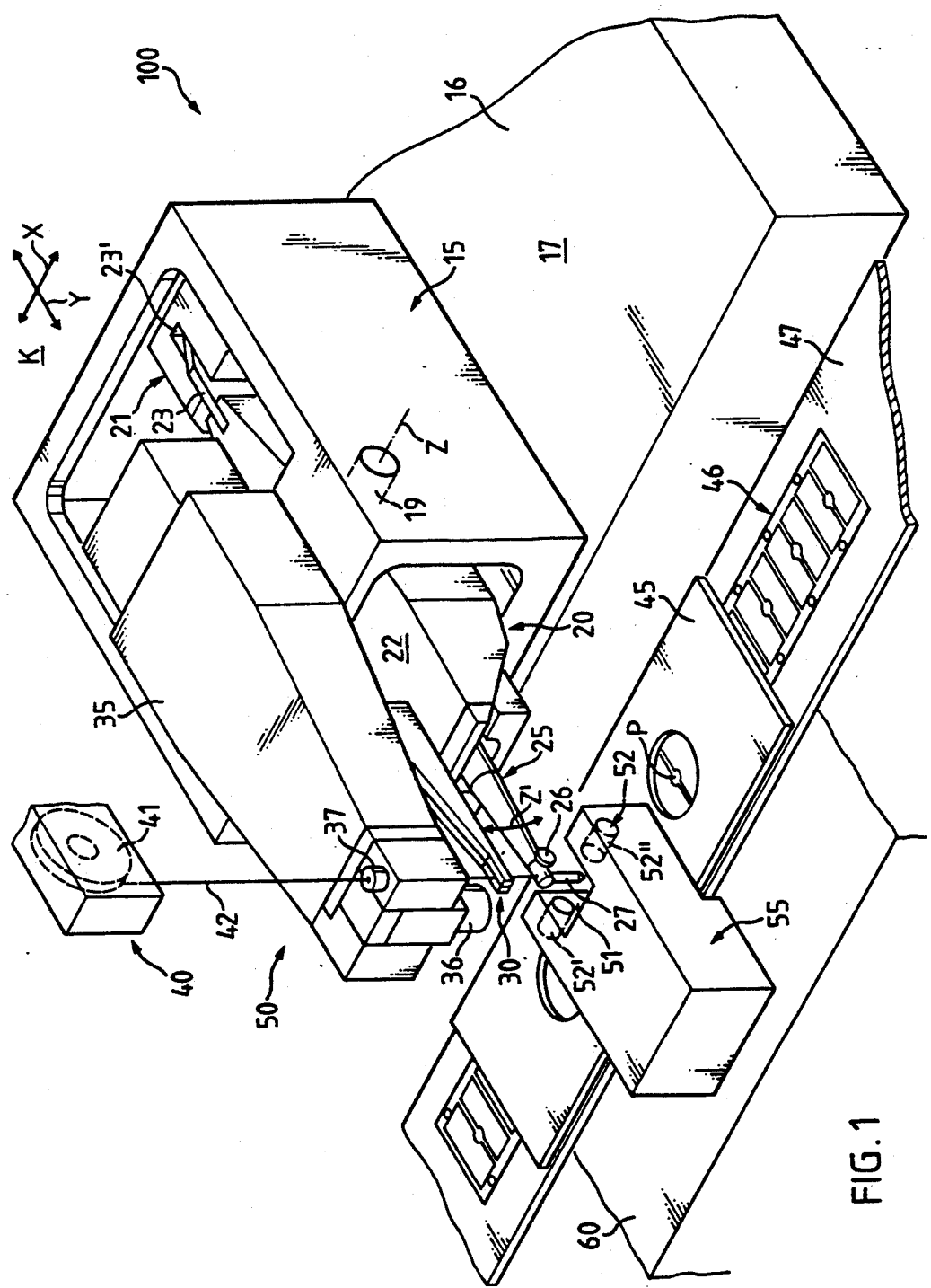
FIG. 1 An apparatus for the ultrasonic contacting wired connection of circuits to electronic components shown in a diagrammatic, perspective view.

In order to illustrate the invention and as a general system survey, FIG. 1 shows in diagrammatic, perspective form an apparatus 100 for semiconductor connection technology. The apparatus 100 is used for the ultrasonic contacting wired connection of circuits to electronic components and essentially comprises a bonding head means 50, a contacting member 20 with correspondingly associated bonding wire clamping device 30 and a diagrammatically represented bonding wire supply device 40.

FIG. 1 also shows a holding plate 45 for a not shown holding-down device with which a metallic leadframe strip 46 precisely oriented with the process point P is held in a positionally stable manner on a bearing plate 47. With the contacting member 20 is associated a measuring head 55 provided with a recess 51 and which is fixed by means of a not shown screw connection or the like to a support element 60 of the apparatus 100.

Between the two spaced walls 51', 51" (FIG. 2) of the recess 51 of the measuring head 55 is provided a capillary 27 of an energy transducer 25 in operative connection with the contacting member 20. The contacting member 20 is pivotable in the direction of arrow Z' about and axis Z together with the energy transducer 25 (FIG. 1). For reasons of simplicity, throughout the remainder of the description the energy transducer 25 will be referred to as transducer 25.

In the measuring head 55 is also provided a sensor 52, which e.g. operates in an optoelectrical manner. The sensor 52 substantially embraces a transmitter part 52' and a correspondingly positioned receiver part 52". The optical operating or measuring range of the sensor 52 is dimensioned in such a way that it covers both the path of the infeed of the bonding head and also a measured quantity of the longitudinal vibration of the transducer 25. The path of the infeed corresponds to several times, e.g. 10 times the ultrasonic amplitude of the capillary 27. The relative movement (longitudinal vibration) of the capillary 27 is measured by the measuring head 55 fixed to the support element 60 constructed as a machine base.

The individual elements of the apparatus 100 shown in FIG. 1 and which are in operative connection with one another will now be described. The bonding head means 50 essentially comprises a casing-like support element 15. The support element 15 is adjustable by means of correspondingly arranged, not shown drives in accordance with a coordinate system K in the plane in the X-direction and/or Y-direction. The support element 15 is provided on a side facing a sliding plate 16 with a not shown, vacuum-prestressable air cushion bearing, so that the support element 15 is movably mounted in a freely suspended manner on the sliding surface 17 of the sliding plate 16. The support element 15 receives and holds the contacting member 20 and an arm 35. On a front end of the arm 35 is placed a correspondingly constructed bonding wire guide member 37 and an optical sensor 36, which is oriented to the process point P of the leadframe strip 46. Through a corresponding direct current excitation of the not shown drives, which are in operative connection with the support element 15, the movement of the latter oriented in the X and/or Y-direction is brought about. A preferred, correspondingly constructed embodiment of said bonding head means 50 is known from EP-A-0 317 787.

The above-described support element 15 receives the contacting member 20. The latter essentially comprises a support frame 22, which is pivotable about the axis Z in the direction of arrow Z', of a shaft 19 mounted in the support element 15. The front area of the support frame 22 is constructed for the mounting of the transducer 25 and the bonding wire clamping device 30 installed thereon. At the front end of the transducer 25 is provided the capillary 27, which is replaceably held and fixed on the transducer 25 by a correspondingly constructed screw connection 26. On the other, rear end of the support frame 22 is provided an electromotive drive 21, which incorporates spaced, not shown stator and bobbin means. Between the stator and bobbin means a sword-like magnet 23 fixed to the support frame 22 is arranged in a gap 23'. Through a corresponding direct current excitation of the bobbin a relative movement of the magnet 23 with respect to the stator means is brought about and consequently a pivoting movement (FIG. 1) of the elements 20, 25 and 30 oriented in the direction of the arrow Z'.

A preferred and correspondingly constructed embodiment of the aforementioned contacting member 20 is known from EP-A-0 340 506.

FIG. 1 also shows the diagrammatically represented bonding wire supply device 40, which incorporates a not shown removal element, by means of which a bonding wire 42 sensed in contact-free manner by a not shown electrical/optical sensor is removed from a correspondingly installed wire reel 41. The bonding wire 42 is guided through the guidance member 37 provided on the arm 35 and is drawn by means of the clamping device 30 from the wire reel 41 and is centrally guided in the capillary 27.

A preferred and correspondingly constructed embodiment of the aforementioned bonding wire supply device 40 is known from EP-A-0 342 358.

Figure 2:
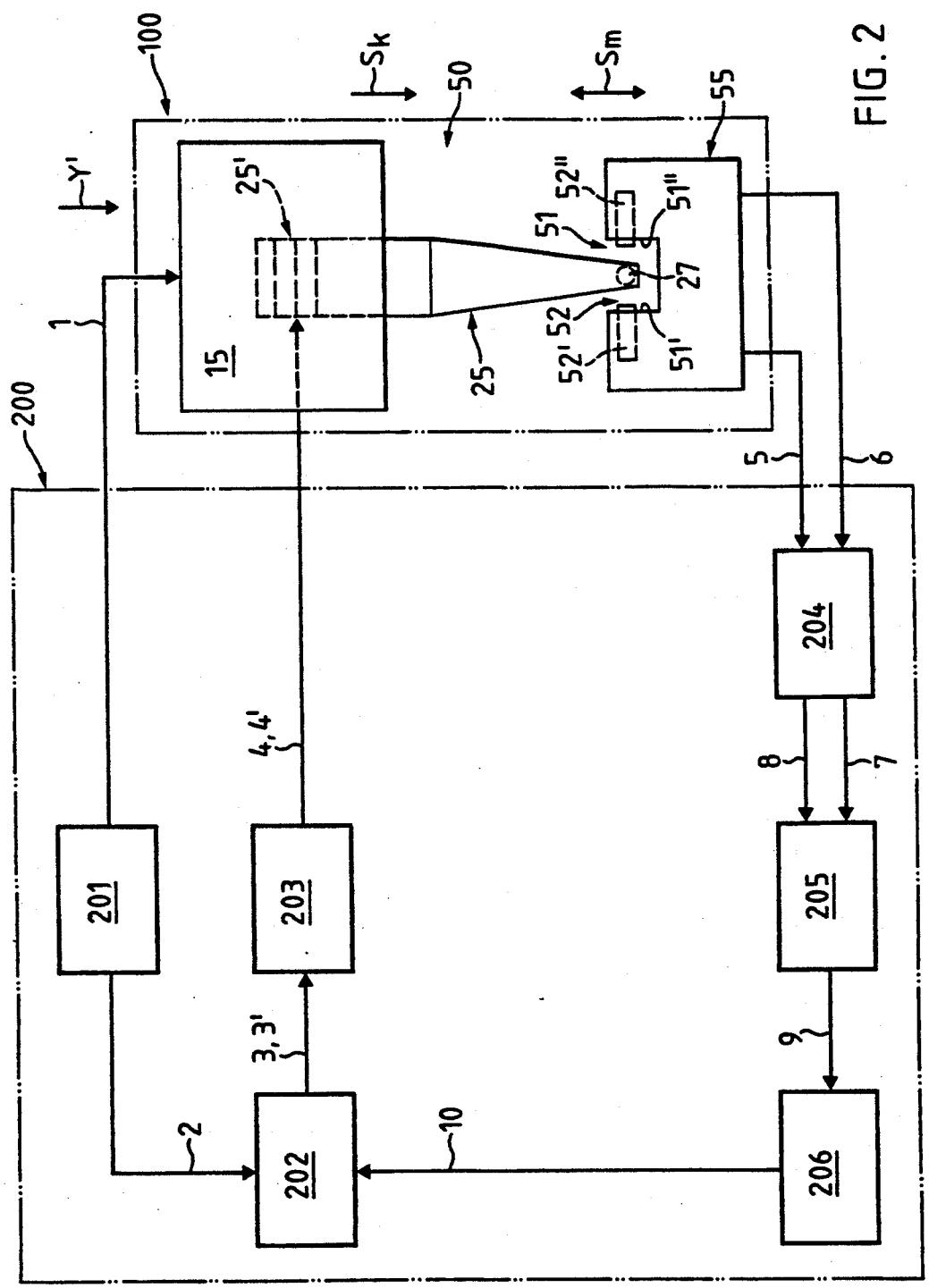
FIG. 2 The sequential control for the apparatus of FIG. 1 shown as a block circuit diagram.

FIG. 2 shows a sequential control represented in block circuit diagram form from which, it is possible to see the diagrammatically represented bonding head means 50 and the measuring head 55 of the apparatus 100, as well as a computer 200. The computer 200 essentially comprises a control unit 201, a multiplier 202, a generator 203, an amplifier 204, a first processor 205 and a second processor 206.

The operation of the apparatus 100 in conjunction with the computer 200 shown in FIG. 2 for the sequential control essentially comprising the measurement of the movement of the bonding head means 50 and the measurement of the vibration amplitude of the transducer 25, as well as the calibration of the individual measured values is described hereinafter.

The control unit 201 supplies a corresponding signal 1 to the not shown electromotive drive, which is in operative connection with the support element 15, so that the bonding head means 50 with the transducer 25 is moved in the direction of the arrow Y' by a predetermined distance $S_k$, the fixed distance $S_k$ being measured by the sensor 52. A signal 5 corresponding to the fixed distance $S_k$ is supplied to the amplifier 204 for conversion into a corresponding voltage $U_k$, the thus determined first voltage $U_k$ either being read off or correspondingly stored.

A preprogrammed, first ultrasonic value is supplied by the control unit 201 as a signal 2 to the multiplier 202 and the latter supplies the generator 203 with a corresponding signal 3. The generator 203 converts the signal 3 into a first voltage and supplies it as a signal 4 to a vibration member 25' operatively connected to the transducer 25, so that a mechanical longitudinal vibration oriented relative to the fixed measuring head 55 is produced on the capillary 27 of the transducer 25 and is measured and determined as a first measured quantity $S_m$ by the sensor 52. A signal 6 corresponding to the first measured quantity $S_m$ (longitudinal vibration) is supplied to the amplifier 204 and converted by the latter into a corresponding, second voltage $U_m$, the thus determined second voltage $U_m$ also being storable.

The amplifier 204 supplies the first processor 205 with the first voltage $U_k$ as a signal 7 and the second voltage $U_m$ as a signal 8 in accordance with the following equation:

$$S_m = S_k \frac{U_m}{U_k}.$$

The processor 205 determines the instantaneous ultrasonic amplitude $S'_m$ and supplies it as the signal 9 to the second processor 206.

In the second processor 206 the instantaneous ultrasonic amplitude $S'_m$ supplied as signal 9 is converted to a corresponding correction factor $K_f$ and is supplied as a signal 10 to the multiplier 202.

In the multiplier 202 the first ultrasonic value supplied as signal 2 by the control unit 201 is multiplied by the determined correction factor $K_f$ and is supplied as a correspondingly corrected signal 3' to the generator 203.

In the generator 203 the signal 3' is converted into a corrected, second voltage and is supplied as the signal 4' to the vibration member 25' operatively connected to the transducer 25.

The inventive method and the apparatus for its performance make it possible to directly and accurately measure the change to the longitudinal vibration caused e.g. by the replacement of the capillary or wear to the latter at the tip of the existing capillary and to correspondingly calibrate the first ultrasonic value with the calculated correction factor.

A particular advantage is that the calibrated ultrasonic value can be reproduced on another bonding means and consequently electrical circuits can be constantly bonded with the same ultrasonic values.

We claim:

1. A method for measuring virbration amplitude of an energy transducer, which is fed to a process point together with a correspondingly constructed bonding head means for ultrasonic contacting wired connection of electrical circuits to metallic leadframe strips, comprising the steps of: supplying a energy transducer with a first ultrasonic value for generating a voltage for producing a mechanical longitudinal vibration; measuring an instantaneous amplitude of the longitudinal vibration of the energy transducer and a predetermined infeed of the bonding head means; determining a correction factor ($K_f$) from the thus established measured quantities; and using the correction factor ($K_f$) for calibrating the first ultrasonic value and consequently the vibration amplitude of the energy transducer.

2. The method according to claim 1, wherein the measuring step includes optoelectrically measuring longitudinal vibration of the energy transducer and the infeed of the bonding head means and further comprising producing from the measured quantities an infeed-proportional, first voltage $U_k$ and a longitudinal vibration-proportional, second voltage $U_m$.

3. The method according to claim 1, wherein the measuring step includes measuring real infeed of the bonding head means as a path ($S_k$) that is converted into the first voltage $U_k$ and stored, and measuring the instantaneous longitudinal vibration amplitude of the energy transducer as a first measured quantity $S_m$ and stored, the determining step including carrying out a mathematical determination of an ultrasonic amplitude ($S'_m$) according to the following equation:

$$S_m = S_k \frac{U_m}{U_k},$$

the thus determined ultrasonic amplitude ($S'_m$) being converted as the correction factor ($K_f$).

4. The method according to claim 1, including multiplying the first ultrasonic value with the mathematically determined correction factor ($K_f$).

5. The method according to claim 1, including mathematically determining the ultrasonic amplitude ($S'_m$) and converting it into the correction factor ($K_f$), and multiplying the first ultrasonic value by said correction factor ($K_f$), when a bonding process is interrupted and at given time intervals.

6. The method according to claim 3, including adjusting the bonding head means with a path distance corresponding to a multiple of the ultrasonic amplitude, and measuring this path distance ($S_k$) and converting it into the first voltage ($U_k$).

7. An apparatus for measuring vibration amplitude of an energy transducer, comprising: a support element with a bearing plate for a metallic leadframe strip; bonding head means, which can be fed in with an energy transducer located on the bonding head means for bonding electric circuits to a process point of the leadframe strip; computing means for activating the energy transducer; and a correspondingly arranged measuring head in operative connection with the computing means and having sensor means with an optical operating area for determining both a path covered for infeed of the bonding head means and a measured quantity for longitudinal vibration of the energy transducer, the measured values being supplied to the computing means for activating the transducer.

8. An apparatus according to claim 7, wherein with respect to the bonding head means, the measuring head is fixed to the support element which is constructed as a machine base.

9. An apparatus according to claim 7, wherein the measuring head has a recess with two spaced walls for receiving a transmitter part and a receiver part of the sensor means, the recess being constructed and dimensioned for receiving a capillary located on the energy transducer.

10. An apparatus according to claim 7, wherein the computing means includes: a control unit, a multiplier and a generator for bringing about the infeed of the bonding head means and for supplying a first ultrasonic value to the energy transducer; an amplifier in which the path of the bonding head means is converted into a first voltage and the measured quantity of the longitudinal vibration amplitude is converted into a second voltage; and a first process for mathematical determination of instantaneous ultrasonic amplitude and a second process for converting the instantaneous ultrasonic amplitude into a correction factor which is multiplied by the multiplier with the first ultrasonic value.

* * * * *